United States Patent [19]

Yamamoto et al.

[11] Patent Number: 4,982,224
[45] Date of Patent: Jan. 1, 1991

[54] PHOTOSENSITIVE MEDIUM CARRYING INFORMATION ASSOCIATED WITH IMAGE FORMING CONDITIONS, AND IMAGE FORMING APPARATUS USING THE PHOTOSENSITIVE MEDIUM

[75] Inventors: Takemi Yamamoto; Jun Sakai, both of Nagoya; Kenji Sakakibara, Ichinomiya; Naoyuki Hatta, Gamagori, all of Japan

[73] Assignee: Brother Kogyo Kabushiki Kaisha, Japan

[21] Appl. No.: 291,618

[22] Filed: Dec. 29, 1988

[30] Foreign Application Priority Data

Jan. 14, 1988 [JP] Japan .................................. 63-3545
Jul. 8, 1988 [JP] Japan ................................ 63-171470

[51] Int. Cl.⁵ ............................................ G03B 27/32
[52] U.S. Cl. ........................................ 355/27; 355/41
[58] Field of Search .................. 355/41, 68, 38, 40, 355/27, 28, 29, 30, 50, 51; 354/21; 430/138

[56] References Cited

U.S. PATENT DOCUMENTS

| | | | |
|---|---|---|---|
| 4,410,265 | 10/1983 | Ovshinsky | 355/51 |
| 4,437,742 | 3/1984 | Taniguchi | 354/21 |
| 4,670,428 | 7/1988 | Watanabe et al. | 355/40 |
| 4,685,786 | 8/1987 | Iida et al. | 354/21 |
| 4,728,996 | 3/1988 | Matsumoto | 355/77 |
| 4,736,215 | 5/1988 | Hudspeth et al. | 354/21 |
| 4,755,446 | 7/1988 | Keys et al. | 430/138 |
| 4,782,365 | 11/1988 | Takagi | 355/41 |

FOREIGN PATENT DOCUMENTS

| | | |
|---|---|---|
| 389493 | 3/1933 | United Kingdom . |
| 906812 | 4/1961 | United Kingdom . |
| 1095473 | 8/1963 | United Kingdom . |
| 1179318 | 8/1967 | United Kingdom . |
| 2086065 | 8/1981 | United Kingdom . |

Primary Examiner—L. T. Hix
Assistant Examiner—Khanh Dang
Attorney, Agent, or Firm—Oliff & Berridge

[57] ABSTRACT

An image forming apparatus including an image forming device for image-wise exposing a photosensitive medium to form an image, and a reading device for reading information which is provided on the photosensitive medium and which is associated with image forming conditions in which the image forming is operated, and which is provided on said photosensitive medium. A control device is provided to control the image forming device according to the information read by said reading device.

10 Claims, 4 Drawing Sheets

PHOTOSENSITIVE MEDIUM CARRYING INFORMATION ASSOCIATED WITH IMAGE FORMING CONDITIONS, AND IMAGE FORMING APPARATUS USING THE PHOTOSENSITIVE MEDIUM

BACKGROUND OF THE INVENTION

1. Field of the Invention

The present invention relates in general to a photosensitive medium, and an apparatus for forming or reproducing an image by using the photosensitive medium, and more particularly to such an image forming apparatus wherein operating conditions can be varied depending upon a specific type of the photosensitive medium.

2. Discussion of the Related Art

Various types of photosensitive media are known in the art of optical formation or reproduction of an image. These photosensitive media exhibit different properties, for example, different photosensitive properties upon image-wise exposure to a radiation to form a latent image, and different properties upon development of the latent image into a visible dye image. Accordingly, the optimum operating conditions under which an image forming apparatus is operated differ depending upon the specific type of the photosensitive medium used. For example, the optimum exposing and developing conditions for a given type of a photosensitive medium are different from those for another type. It is therefore desirable to operate the image forming apparatus under the conditions that best suit the specific photosensitive medium. To achieve this desire, it is necessary to control the exposing, developing and other devices of the apparatus according to given information indicative of the optimum operating conditions. For instance, the information for the specific photosensitive medium may be stored into a memory, by the user of the image forming apparatus.

However, the procedure for manually storing the necessary information on the optimum exposing, developing and other image forming operations is not only very cumbersome and time-consuming, but also liable to an error in keying in the information into the memory, which may cause a failure to reproduce the desired image.

SUMMARY OF THE INVENTION

The present invention was developed in an effort to solve the above problem. It is accordingly an object of the present invention to provide an image forming apparatus wherein the optimum exposing, developing and other conditions to form an image using a photosensitive medium are automatically given to appropriate image forming devices, without the user of the apparatus entering information on these operating conditions.

The above object may be achieved according to the principle of the present invention, which provides an image forming apparatus comprising: image forming means for image-wise exposing a photosensitive medium to form an image; reading means for reading information which is associated with image forming conditions of the image forming means and which is provided on the photosensitive medium; and control means for controlling the image forming means according to the information read by the reading means.

In the image forming apparatus of the present invention constructed as described above, the reading means reads the information on the image forming conditions such as exposing and developing conditions, which information is provided on the photosensitive medium. The control means controls exposing, developing and other devices of the image forming means, according to the read information on the image forming conditions.

Thus, the instant image forming apparatus is capable of automatically reading the optimum exposing, developing and other image forming conditions from the photosensitive medium, and therefore frees the operator from a cumbersome, time-consuming procedure to supply the apparatus with the appropriate information on the optimum operating conditions to accurately reproduce a desired image.

The photosensitive medium may be a photosensitive web. In this case, the information on the image forming conditions may be provided on a leading portion of the photosensitive web. The control means may include a non-volatile memory for storing the information. The term "leading portion" of the photosensitive web should be interpreted to mean either a leader provided exclusively for carrying the information just before the leading end of the web, or the leading end portion of the photosensitive web.

The reading means may include medium detecting means for detecting a presence of the photosensitive medium. Further, the control means may include memory means for storing the image forming conditions for each of a plurality of different types of the photosensitive medium. In this instance, the photosensitive medium carries the information indicative of the type of the photosensitive medium, and the control means reads out from the memory means the image forming conditions for the type of the photosensitive medium which is read by the reading means, and controls the image forming means according to the image forming conditions which have been read out from the memory means.

The reading means may include light-emitting means for irradiating the photosensitive medium with a radiation having a wavelength range to which the medium is not sensitive, and light-sensitive means for receiving the radiation reflected by the medium.

It is another object of the present invention to provide a photosensitive medium which permits an image forming apparatus to form an image under optimum conditions that suit the properties of the medium.

The above object may be accomplished according to another aspect of the present invention, which provides a photosensitive web used by an image forming apparatus to form an image, the web comprising a leading portion which carries thereon information associated with image forming conditions under which the photosensitive web is image-wise exposed to form the image.

The leading portion of the photosensitive web may carry an indicia representative of the information, and the indicia may comprise a bar code wherein a plurality of parallel stripes are arranged so as to intersect a longitudinal direction of the photosensitive medium.

In one form of the photosensitive web of the present invention, a latent image is formed by image-wise exposing the web, and the latent image is developed into a visible image, which is then fixed by suitable means. In this case, the information provided on the leading portion of the photosensitive web is indicative of at least one of an optimum exposing time during which the photosensitive medium is image-wise exposed to form the latent image, an optimum developing condition under which the latent image is developed into the visible image, and an optimum temperature at which the visible image is fixed. The photosensitive web may be a pressure-sensitive photosensitive web wherein the latent image is developed into the visible image by application of a pressure to an image-wise exposed portion of the web. In this case, the information preferably includes information indicative an optimum value of the pressure.

BRIEF DESCRIPTION OF THE DRAWINGS

The foregoing and optional objects, features and advantages of the present invention will become more apparent by reading the following detailed description of a presently preferred embodiment of the invention, when considered in connection with the accompanying drawings, in which.

DETAILED DESCRIPTION OF THE PREFERRED EMBODIMENT

Figure 1:
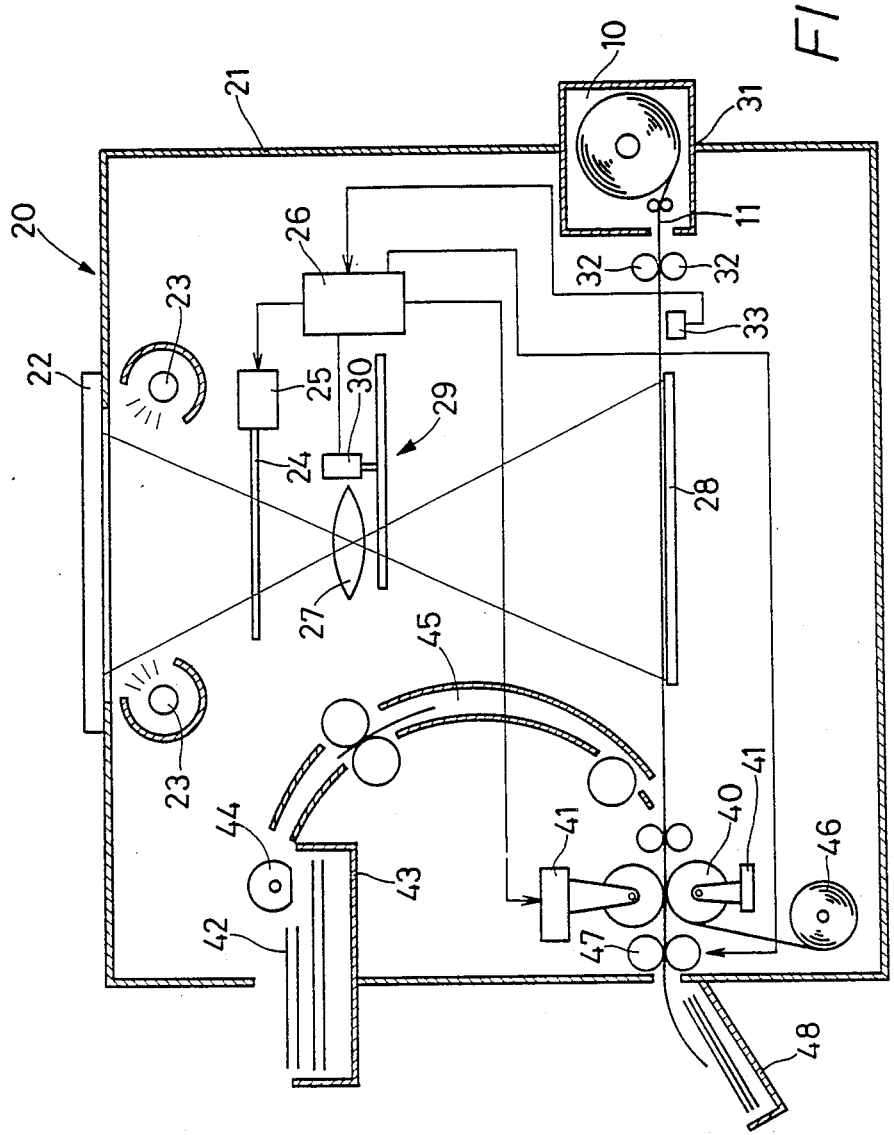
FIG. 1 is a schematic elevational view in cross section of one embodiment of an image forming apparatus of the present invention.

Referring first to FIG. 1, reference numeral 20 generally denotes an image forming apparatus for reproducing a desired original image or subject copy. The image forming apparatus 20 uses a photosensitive web 11 which has a layer of photosensitive microcapsules each having a chromogenic material or color precursor as well known in the art. The photosensitive web 11 is supplied from a web cassette 10 which is removably received in a receptacle 31 provided in a side wall of a frame 21 of the apparatus.

Figure 2:
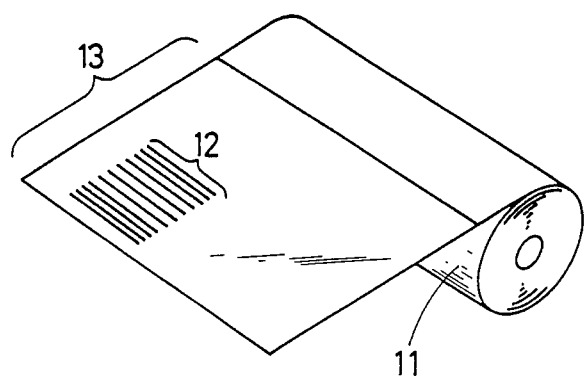
FIG. 2 is a perspective view showing a photosensitive web and a leader attached to the leading end of the web.
Figure 3:
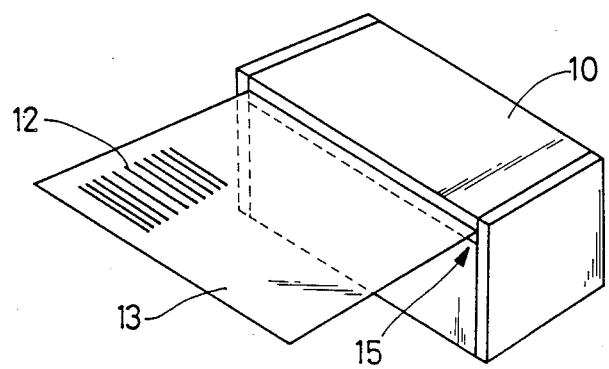
FIG. 3 is a perspective view showing a web cassette and the leader of the web extending from the web cassette.

As also shown in FIGS. 2 and 3, the web cassette 10 rotatably supports a roll of the photosensitive web 11, so that the web 11 is delivered through a delivery slot 15 formed in the cassette casing. The photosensitive web 11 has an aluminum layer formed by vapor deposition on a back surface thereof opposite to the microcapsule layer indicated above. The photosensitive web 11 is provided with a leader 13 consisting of a suitable sheet fixed to the leading edge. The leader 13 has the same width as the web 11, and functions to facilitate initial setting of the photosensitive web 11 along a predetermined feed path from the web cassette 10. In this embodiment, the leader 13 has another function. Described more specifically, the leader 13 carries an indicia in the form of a bar code 12, on the surface on the same side as the back surface of the web 11 on which the aluminum layer is formed. The bar code 12 represent information associated with optimum image forming conditions under which the instant apparatus is operated to image-wise expose the web 11 to form a latent image thereon, develop the latent image into a visible dye image on a developer sheet 42 (which will be described), and fix the visible image on the developer sheet 42.

The bar code 12 include an array of a plurality of parallel stripes arranged so as to extend in a direction perpendicular to the longitudinal or feeding direction of the photosensitive web 11. The roll of the web 11 is accommodated in the optically shielded web cassette 10 such that the web 11 may be fed outside the cassette casing through the delivery slot 15, as illustrated in FIG. 3.

Referring back to FIG. 1, a subject copy sheet or an original which bears a desired image to be reproduced is supported on the top wall of the frame 21 and is covered by a covering plate 22 disposed on the top wall. Beneath the covering plate 22, there is disposed an exposing device for image-wise exposing an appropriate portion of the photosensitive web 11, so as to form thereon a latent image corresponding to the original image. The exposing device includes two light sources 23 which are disposed below opposite end portions of the covering plate 22. The light sources 23 are adapted to produce radiations to irradiate the original. Below and between the light sources 23, there are provided a shutter 24 for shielding the radiation reflected by the original, and a shutter drive 25 for moving the shutter 24 between a first position for shielding the reflected radiation, and a second position in which the reflected radiation is permitted to be propagated toward an exposing station 28 which will be described. The shutter drive 25 is connected to a controller 26, so that the shutter drive 25 is controlled so as to move the shutter 24 between the first and second positions, as needed.

Figure 4:
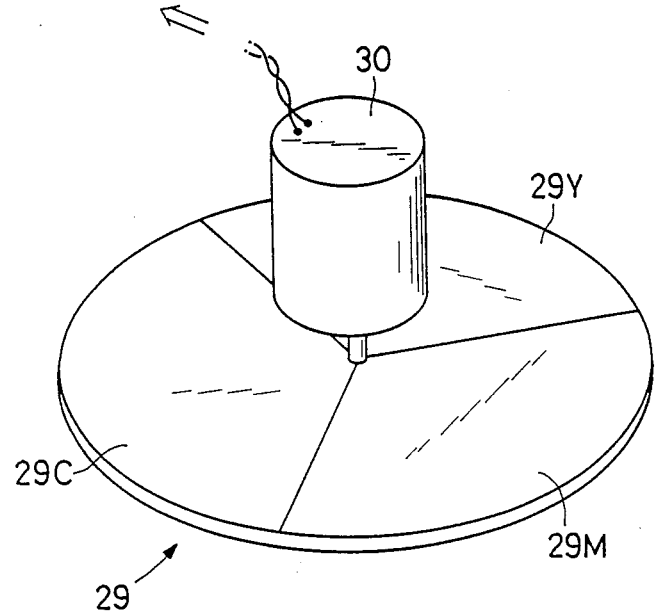
FIG. 4 is a perspective view showing a rotary color filter unit incorporated in the apparatus.

Right below the shutter 24, there is disposed a focusing lens 27 so that the reflected light from the original is focused by the lens 27 on the exposing station 28 which defines a portion of the feed path of the photosensitive web 11. Between the focusing lens 27 and the exposing station 28, there is provided a rotary color filter unit 29 as shown in FIG. 4. This filter unit 29 includes a rotary disk rotated by a stepping motor 30. The rotary disk consists of three sectors which respectively serve as a yellow filter 29Y, a magenta filter 29M and a cyan filter 29C. The yellow, magenta and cyan filters 29Y, 29M and 29C transmit radiations having wavelengths which correspond to yellow, magenta and cyan microcapsules of the photosensitive web 11. The filters 29Y, 29M and 29C are selectively brought into the operative position on a path of the reflected radiation, that is, right below the focusing lens 27, with the rotary disk rotated by the stepping motor 30. The stepping motor 30 is also connected to the controller 26 so that the motor 30 is driven according to a control signal from the controller 26.

To the left of the web cassette 10, there are disposed a pair of feed rolls 32 which cooperate with each other to automatically feed out the leader 13 of the photosensitive web 11 from the cassette 10 toward the exposing station 28 when the cassette 10 is installed in position in the receptacle 31 in the frame 21. Between the feed rollers 32 and the exposing station 28, and below the feed path of the web 11, there is provided an optical reading device in the form of a bar code reader 33.

Figure 5:
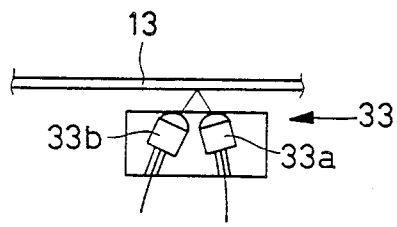
FIG. 5 is an elevational view illustrating a bar code reader incorporated in the apparatus.

As illustrated in FIG. 5, the bar code reader 33 includes a light-emitting element 33a for producing a light beam toward the leader 13 or the aluminum layer of the photosensitive web 11, and a light-sensitive element 33b for receiving the light beam reflected by the surface of the leader 13 or aluminum layer of the web 11, whereby the bar code 12 on the leader 13 is read or the presence (trailing end) of the photosensitive web 11 is detected. The bar code reader 33 is also connected to the controller 26, so that the controller 26 receives the output of the light-sensitive element 33b which represents the bar code 12 or the presence or absence of the web 11 passing the reader 33.

To the left of the exposing station 28, there are disposed a pair of developing rolls 40 which are rotatably supported by respective presser devices 41, such that the photosensitive web 11 is passed through a pressure nip between the two developing rolls 40. The presser devices 41 are connected to the controller 26, so that the squeezing pressure of the developing rolls 40 which acts on the web 11 is adjusted to a controlled value. Above the developing rolls 40, there is provided a sheet cassette 43 which accommodates a stack of developer sheets 42. The developer sheets 42 have a layer of a developer material which is capable of chemically reacting with the chromogenic material contained in the microcapsules of the photosensitive web 11, as well known in the art. Adjacent to the stack of the developer sheets 42 in the cassette 43, there is disposed a feed roll 44 for delivering the developer sheets 42 one at a time, into a sheet guide 45, so that the developer sheet 42 is superimposed on the image-wise exposed length of the photosensitive web 11. The superimposed developer sheet 42 and photosensitive web 11 are passed through the pressure nip between the developing rolls 40.

Upon insertion of the web cassette 10 in the frame 21, the leader 13 of the photosensitive web 11 is threaded along the feed path which is defined by the nip of the feed rolls 32, upper surface of the exposing station 28, nip of the developing rolls 40, and a take-up spool 46 disposed below the developing rolls 40. The leader 13 is bonded to the take-up spool 46. The web 11 delivered by the feed rolls 32 from the cassette 10 is fed toward the developing rolls 40 by a first feed mechanism (not shown), and rewound on the take-up spool 46 by a second feed mechanism (not shown). The developer sheet 42 which has passed the pressure nip of the rolls 40 is separated from the photosensitive web 11 is fed through a pressure nip between a pair of heater rolls 47 disposed to the left of the rolls 40. The heater rolls 47 are connected to the controller 26 so that the heating temperature of the rolls 47 is controlled. The developer sheet 42 which has passed the heating rolls 47 is received by a tray 48 attached to the side wall of the frame 21 adjacent to the rolls 47.

Figure 6:
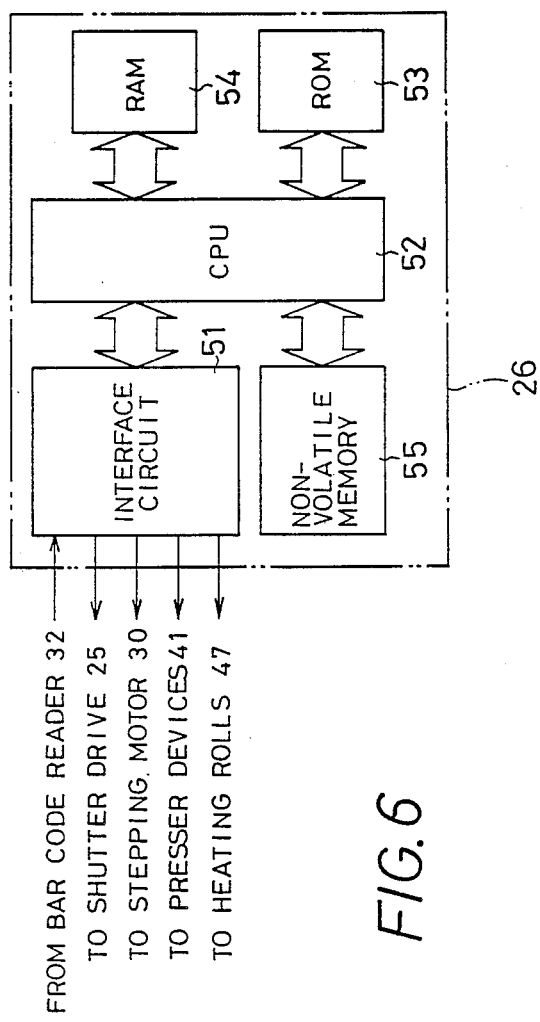
FIG. 6 is a block diagram showing a controller of the apparatus.

There will next be described an arrangement of the controller 26, by reference to the block diagram of FIG. 6. The controller 26 includes an interface circuit 51, and a CPU (central processing unit) 52, to which are connected through the interface circuit 51 the bar code reader 33, shutter drive 25, stepping motor 30, presser devices 41 and heater rolls 47. The CPU 52 are connected to a ROM (read-only memory) 53 and a RAM (random-access memory) 54. The CPU 52 operates to control the instant image forming apparatus, according to a control program stored in the ROM 53, while utilizing a temporary data storage function of the RAM 54. The controller 26 further incorporates a non-volatile memory 55 that retains information stored therein, even in the absence of power.

An image forming operation in the instant apparatus is effected in the following manner.

Upon installation of the web cassette 10 in the receptacle 31, the leader 13 is fed past the bar code reader 33 by the feed rolls 32. The bar code reader 33 reads the bar code 12 provided on the leader 13 of the web 11, and the output of the light-sensitive element 33b representing the bar code 12 is applied to the controller 26. It is noted that the feeding movement of the leader 13 by the feed rolls 32 is used by the bar code reader 33 to read the bar code 12. Therefore, there is no need to provide a scanning mechanism for moving the bar code reader 33 relative to the leader 13. In the present embodiment, the bar code 12 represents the following information: optimum exposing times Ty, Tx and Tc for yellow, magenta and cyan light beams which are propagated through the respective yellow, magenta and cyan filters 29Y, 29M and 29C of the rotary color filter unit 29; optimum squeezing pressure N at the nip of the developing rolls 40, which is produced by the presser devices 41; and optimum heating temperature T of the heater rolls 47. The information which is represented by the bar code 12 and fed to the controller 26 in the form of the output of the light-sensitive element 33b is stored in the non-volatile memory 55. As described above, the leader 13 and the following photosensitive web 11 are threaded past the exposing station 28 to the take-up spool 46 via the pressure nip of the developing rolls 40.

After the photosensitive web 11 is properly set in the apparatus and the bar code 12 is read and stored in the non-volatile memory 55, the light sources 23 are energized to irradiate the original retained by the covering plate 22. The controller 26 operates the stepping motor 30 so as to bring the yellow filter 29Y of the filter unit 29 in the operating position right under the focusing lens 27. At the same time, the controller 26 controls the shutter drive 25 so that the shutter 24 is held in the second position for the exposing time Ty. As a result, the yellow component of the radiation reflected by the original is focused on a portion of the photosensitive web 11 at the exposing station 28, whereby a latent image corresponding to the yellow component of the original image is formed by the exposed and non-exposed microcapsules of the web 11 which correspond to the yellow pigment.

When the predetermined exposing time Ty for exposing the yellow microcapsules has elapsed, the shutter 24 is returned to the first position to shield the reflected radiation from the original. Then, the controller 26 operates the stepping motor 30 to index the filter unit 29 so that the magenta filter 29M is positioned right below the focusing lens 27. The shutter 24 is brought to the second position to permit the reflected radiation to be transmitted through the magenta filter 29M, for the predetermined exposing time Tm. Thus, a magenta image is superposed on the yellow latent image already formed on the exposed portion of the web 11. Similarly, a cyan image is formed by exposure to the cyan component of the reflected radiation through the cyan filter 29C for the predetermined exposing time Tc.

When the exposing operation described above is completed, the take-up spool 46 is rotated to feed the image-wise exposed length of the photosensitive web 11 toward the developing rolls 40. At the same time, the uppermost developer sheet 42 is delivered by the feed roll 44 from the cassette 43, and the developer sheet 42 is superposed on the exposed length of the web 11. The superposed developer sheet 42 and the exposed portion of the web 11 are passed through the pressure nip of the developing rolls 40. The controller 26 controls the presser devices 41 so that the squeezing or developing pressure of the developing rolls 40 is adjusted to the predetermined value N. As a result of the pressure application to the image-wise exposed portion of the web 11, the uncured microcapsules of the web 11 which have not been exposed to the radiation from the original are ruptured, and the chromogenic material of the ruptured microcapsules chemically reacts with the developer material on the developer sheet 42, whereby the composite full color latent image on the web 11 is developed into a visible dye image on the developer sheet 42. While the exposed length of the web 11 is rewound on the take-up spool 46, the developer sheet 42 is passed through the nip of the heater rolls 47, so that the visible image is fixed on the developer sheet 42. The temperature of the heater rolls 47 is controlled to the predetermined value T, by the controller 26. The developer sheet 42 which has left the heater rolls 47 is received by the tray 48.

While an image forming operation is effected in the manner as described above, the light beam emitted by the light-emitting element 33a of the bar code reader 33 is reflected by the vapor-deposited aluminum layer on the back surface of the photosensitive web 11 and received by the light-sensitive element 33b, as long as the web 11 is present at the position of the reader 33. Thus, the controller 26 can detect the presence or absence of the web 11, and can detect the leading and trailing ends of the web 11. When the trailing end is detected, the take-up spool 46 is rotated to rewind the remaining length of the web 11, with the trailing end released from the spool in the web cassette 10. The controller 26 commands a suitable display (not shown) to provide an indication that the entire length of the web 11 has been consumed.

In the present embodiment wherein the information read by the bar code reader 33 is stored in the non-volatile memory, the information is retained even after the apparatus is turned off. It is further noted that the bar code reader 33 and the aluminum layer on the web 11 cooperate to detect the leading and trailing ends of the web 11, or the absence or presence of the web at the position of the reader 33. Therefore, no device exclusively provided for detecting the web 11 is necessary.

While the present invention has been described in its presently preferred embodiment for illustrative purpose only, it is to be understood that the invention is not limited to the precise details of the illustrated embodiment, but may be embodied with various changes, modifications and improvements, which may occur to those skilled in the art, in the light of the foregoing teaching, without departing from the spirit and scope of the invention.

For instance, the aluminum layer vapor-deposited on the back surface of the web 11 may be replaced by suitable indicia at the trailing end, or leading and trailing ends of the web 11.

In the illustrated embodiment, the information associated with the image forming conditions in the form of the bar code 12 is provided on the leader 13 attached to the leading end of the web 11. However, the information may be provided on the leading end portion of the web 11. Further, the information may be provided in suitable forms other than a bar code, such as punched holes formed in the leader 13 or the leading end portion of the web 11, and a magnetic tape attached as a leader to the leading end of the web 11. The direction of extension of the stripes of the bar code 12 need not be perpendicular to the feeding or longitudinal direction of the web 11, provided that the direction of extension intersects the feeding direction.

In the illustrated embodiment, the bar code 12 itself represents the necessary information associated with the optimum operating conditions (e.g., exposing and developing conditions) of the apparatus, it is possible that the ROM 53 stores sets of information for different types of photosensitive media, while the information indicative of the type of the photosensitive medium used is provided on the photosensitive medium, so that the controller 26 selects the set of information which corresponds to the photosensitive medium used. Further, the information may be provided on the front surface of the web 11 on which the microcapsule layer is formed, provided the photosensitive medium is not sensitive to the wavelength of the light beam produced by the bar code reader 33 or other optical reading device.

What is claimed is:

1. An image forming apparatus comprising:
a photosensitive medium including a photosensitive layer, a light-reflecting backing layer disposed opposite said photosensitive layer, and a leader portion, medium information carried by the leader portion on the surface of said leader portion which corresponds to said light-reflecting backing layer;
image forming means including exposing means for image-wise exposing said photosensitive layer to form an image, and feeding means for feeding the photosensitive medium in a longitudinal direction thereof, said medium information being associated with image forming conditions of said image forming means;
reading means including means for emitting a radiation for irradiating said leader portion so as to read said medium information, and irradiating said light-reflecting backing layer so as to detect the presence of said photosensitive layer during feeding of the photosensitive medium in the longitudinal direction;
said light-reflecting backing layer preventing said photosensitive layer from being exposed to said radiation; and
control means for controlling said image forming means according to a first output of said reading means which is indicative of said medium information, and controlling the apparatus according to a second output of the reading means which is indicative of the presence or absence of said light-reflecting backing layer.

2. An image forming apparatus according to claim 1, wherein said photosensitive medium consists of a photosensitive web, and said leader portion is a leader which is attached to a leading end of said photosensitive layer as viewed in a longitudinal direction of the photosensitive web, said control means including a non-volatile memory for storing said medium information.

3. An image forming apparatus according to claim 1, wherein said photosensitive medium consists of a photosensitive web, and said leader portion is a leading end portion of said photosensitive layer as viewed in a longitudinal direction of the photosensitive web.

4. An image forming apparatus according to claim 1, wherein said control means includes memory means for storing said image forming conditions for each of a plurality of different types of said photosensitive medium, said photosensitive medium carrying said information which is indicative of the type of said photosensitive medium, said control means reading out from said memory means the image forming conditions for the type of the photosensitive medium which is read by said reading means, and controlling said image forming means according to said image forming conditions which have been read out from said memory means.

5. A photosensitive web used by an image forming apparatus to form an image, comprising a photosensitive layer, a light-reflecting backing layer for backing said photosensitive layer, and a leader portion which carries thereon medium information associated with image forming conditions under which the photosensitive web is image-wise exposed to form the image, said medium information being provided on one of opposite surfaces of said leader portion which corresponds to said light-reflecting backing layer, said light-reflecting backing layer comprising means for preventing said photosensitive layer from being exposed to a radiation for reading said medium information, and for reflecting said radiation, so that the reflected radiation indicates the presence of said photosensitive layer.

6. A photosensitive web according to claim 5, wherein said leading portion carries an indicia representative of said information, said indicia comprising a bar code wherein a plurality of parallel stripes are arranged so as to intersect a longitudinal direction of said photosensitive medium.

7. A photosensitive web according to claim 5, wherein a latent image formed by image-wise exposure of the web is developed into a visible image, and said visible image is fixed, said information is indicative of at least one of an optimum exposing time during which said photosensitive medium is image-wise exposed to form said latent image, an optimum developing condition under which said latent image is developed into said visible image, and an optimum temperature at which said visible image is fixed.

8. A photosensitive web according to claim 7, wherein said photosensitive web consists of a pressure-sensitive photosensitive web wherein said latent image is developed into said visible image by application of a pressure to an image-wise exposed portion of the web, and said information is indicative of at least an optimum value of said pressure.

9. An image forming apparatus comprising:

a photosensitive medium which has a photosensitive area sensitive to a first radiation having a first wavelength, and which carries medium information on a surface of a leading end portion of said photosensitive area; image forming means including exposing means for exposing said photosensitive area with said first radiation;

reading means including means for emitting a second radiation having a second wavelength different from said first wavelength for irradiating the surface of said leading end portion so as to read said medium information, and for irradiating said photosensitive area so as to detect the presence of said photosensitive area; and control means for controlling said image forming means according to a first output of said reading means which is indicative of said medium information, and controlling the apparatus according to a second output of the reading means which is indicative of the presence or absence of said photosensitive area.

10. A photosensitive web used by an image forming apparatus to form an image, comprising a photosensitive area which is sensitive to a first radiation having a first wavelength, said photosensitive area having a leading end portion which carries thereon means for defining medium information associated with at least two image forming conditions under which the image is formed on the photosensitive web, said means for defining medium information being readable by a second radiation having a second wavelength different from said first wavelength.

* * * * *